United States Patent [19]
Bishop

[11] Patent Number: 6,054,796
[45] Date of Patent: Apr. 25, 2000

[54] POSITIVE FEEDBACK RESONANT TRANSDUCER CIRCUIT

[75] Inventor: Richard Patten Bishop, Fairfax Station, Va.

[73] Assignee: Face International Corp., Norfolk, Va.

[21] Appl. No.: 09/118,136

[22] Filed: Jul. 16, 1998

[51] Int. Cl.[7] .................................................. H01L 41/107

[52] U.S. Cl. ...................................... 310/316.01; 310/318

[58] Field of Search .............................. 310/316.01, 318, 310/359

[56] References Cited

U.S. PATENT DOCUMENTS

| | | | |
|---|---|---|---|
| 3,690,309 | 9/1972 | Pluzhnikov et al. | 310/318 |
| 3,707,636 | 12/1972 | Inoue | 310/318 |
| 3,708,701 | 1/1973 | Kowada | 310/318 |

*Primary Examiner*—Thomas M. Dougherty
*Attorney, Agent, or Firm*—Stephen E. Clark

[57] ABSTRACT

A circuit including a transformer, preferably a laminated piezoelectric transducer, in combination with a positive feedback amplifier circuit, capable of serving: 1) to produce either an audible or ultrasonic signal; or 2) as an energy source capable of driving an auxiliary high voltage device with an initial and continuing low voltage source such as a battery.

4 Claims, 6 Drawing Sheets

POSITIVE FEEDBACK RESONANT TRANSDUCER CIRCUIT

FIELD OF THE INVENTION

The present invention relates to a positive feedback amplifier circuit that preferably includes a resonating piezoelectric transformer device. The preferred combined circuit can be used as a device that emits audible or ultrasonic signals, or to very efficiently power an auxiliary high voltage electronic device using a low voltage power source.

BACKGROUND OF THE INVENTION

Resonant transducers or transformers capable of stepping up an input voltage are well known in the art. It is similarly well known that such devices will operate most efficiently, i.e. produce the most or optimum gain, at their resonant frequency. Such resonant transducers are useful in situations where it is necessary or desirable to drive an electronic device with a relatively high voltage, while the only available power supply may be of relatively low voltage. For example, it may be desirable to use a 6 or 9 volt battery, for reasons of compactness or remoteness, to power a device requiring a 120–150 volt input.

U.S. patent application Ser. No. 08/864,029 filed May 27, 1997 describes a multilayered, laminated, piezoelectric transformer which demonstrates the ability to convert a primary or input voltage V1 to a higher secondary or output voltage V2 through the application of V1 to a first polarized piezoelectric ceramic wafer to generate an extensional stress which is then mechanically transmitted to a second tightly adhered polarized piezoelectric ceramic wafer which undergoes a similar and proportional extensional stress producing V2. The ratio of the first voltage V1 to the second voltage V2 is a function of the piezoelectric properties of the two wafers, the size and geometry of the two wafers and the size and elasticity of the ceramic wafers and other adhesive and pre-stress layers as well as the polarizing characteristics of the ceramic wafers utilized in the devices described in the above-referenced U.S. Patent Application. Similarly, the resonant frequency of a particular design of such a device will be determined by the same parameters.

SUMMARY OF THE INVENTION

According to the present invention, there is provided a circuit which preferably incorporates the previously referenced laminated piezoelectric transducer in combination with a positive feedback amplifier circuit to yield a device capable of serving: 1) to produce either an audible or ultrasonic signal; or 2) as an energy source capable of driving an auxiliary high voltage device with an initial low voltage input.

The resonating (i.e. oscillating) transducer piezoelectrically generates an output ("secondary") voltage of alternatingly positive and negative polarity. This voltage is stepped up and temporarily stored by a rectifier-capacitor array and subsequently supplemented with voltage from a relatively low voltage make-up battery. A supplemented, stepped up voltage of reversed polarity is then fed back into the "primary" side of the transducer during each half cycle of operation. Sequencing and application of the reverse polarity voltage to the primary side of the transducer is accomplished by an operational amplifier which alternatingly drivers a pair of power transistors whose output is communicated to the primary side of the transducer. The described process is repeated, and voltage output from the secondary side of the transducer continues to increase, until the circuit reaches steady state, typically after several cycles of transient operation. As the capacitors or the rectifier-capacitor array become charged, the electrical impedance of the array (and therefore the impedance seen at the secondary side of the transducer) decreases. As the impedance decreases, the voltage gain of the disclosed transducer inherently decreases. The ultimate voltage gain of the circuit can therefore be determined by matching the impedance of the rectifier-capacitor array and the transducer at the desired voltage output/gain.

Accordingly, it is an object of the present invention to provide a positive feedback resonant transducer circuit for generating a relatively high alternating voltage from one or more relatively low direct voltage sources.

It is another object of the present invention to provide a circuit of the character described in which the voltage is stepped up by a piezoelectric transformer.

It is another object of the present invention to provide a circuit of the character described in which the stepped up voltage is fed back into the primary side of the piezoelectric transformer to produce a supplemented stepped up voltage at the secondary side of the transformer.

It is another object of the present invention to provide a circuit of the character described in which the piezoelectric transformer comprises a pair of piezoceramic layers intimately bonded together.

It is another object to provide a modification of the present invention in which the piezoelectric transformer produces an acoustic or ultrasonic signal.

It is another object to provide a modification of the present invention in which the stepped up voltage is used to drive an auxiliary high voltage device.

Further objects and advantages of my invention will become apparent from a consideration of the drawings and ensuing description thereof.

DETAILED DESCRIPTION OF THE INVENTION

According to the present invention, there is provided an electrical circuit which incorporates a transformer or resonant transducer, preferably a laminated such transducer, in combination with a positive feedback amplifier circuit to yield a device capable of serving: 1) to produce either an audible or ultrasonic signal; or 2) as a constant, very low loss, energy source capable driving an auxiliary high voltage device with a low input voltage.

Figure 1:
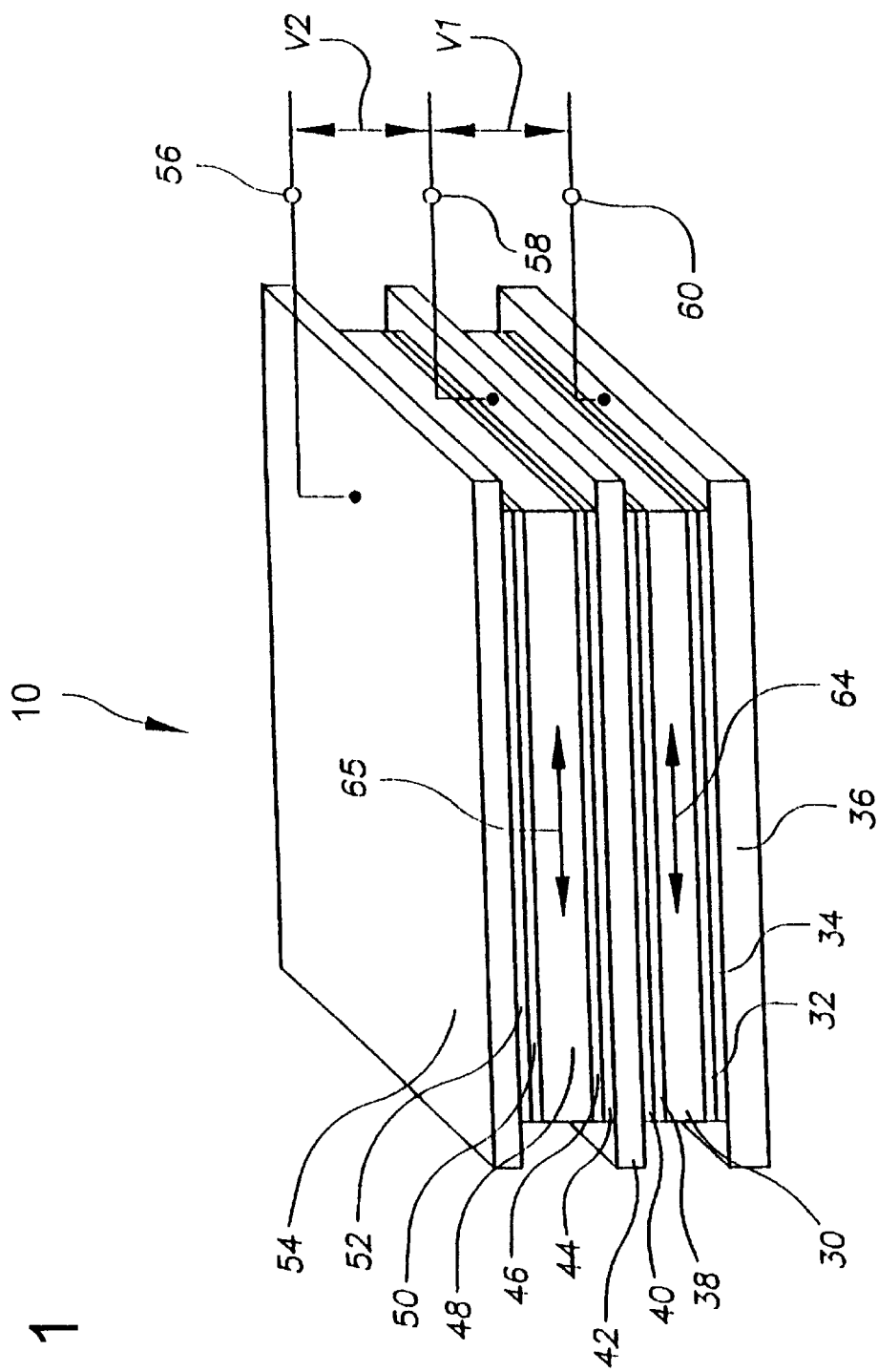
FIG. 1 is a perspective view showing a piezoelectric transformer used in the preferred circuit of the present invention.

As shown in FIG. 1, the preferred piezoelectric transformer 10 used in the circuit of the present invention, is manufactured by stacking and bonding together a number of laminate layers.

A first piezoelectric ceramic wafer 30 is preferably in the form of a slab having two substantially parallel major faces 32 and 38 that are each electroplated. A second piezoelectric ceramic wafer 48 is preferably in the form of a slab having two substantially parallel major faces 46 and 50 that are each electroplated.

A first pre-stress layer 36 is positioned adjacent one electroplated surface 32 of the first piezoelectric ceramic wafer 30. An adhesive layer 34 is disposed between the first pre-stress layer 36 and the adjacent electroplated surface 32 of the first piezoelectric ceramic wafer 30 for purposes of bonding the two members together. The first pre-stress layer 36 is preferably of a conductive material, preferably a metal, having a coefficient of thermal expansion/contraction which is greater than that of the material of the first ceramic wafer 30.

A second pre-stress layer 42 is positioned adjacent the other electroplated surface 38 of the first piezoelectric ceramic wafer 30. An adhesive layer 40 is disposed between the second pre-stress layer 42 and the adjacent electroplated surface 38 of the first piezoelectric wafer 30 for purposes of bonding the two members together. The second pre-stress layer 42 is preferably a conductive material, preferably a metal, having a coefficient of thermal expansion/contraction which is greater than that of the material of the first ceramic wafer.

An electroplated surface 46 of the second piezoelectric ceramic wafer 48 is positioned adjacent the second pre-stress layer 42, such that the second pre-stress layer 42 is between the two ceramic wafers 30 and 48, as shown in FIG. 1. An adhesive layer 44 is disposed between the second pre-stress layer 42 and the adjacent electroplated surface 46 of the second piezoelectric ceramic wafer 48 for purposes of bonding the two members together. The first pre-stress layer 36 preferably has a coefficient of thermal expansion/contraction greater than that of the material of the second ceramic wafer 48.

A third pre-stress layer 54 is positioned adjacent the other electroplated surface 50 of the second piezoelectric ceramic wafer 48. An adhesive layer 52 is disposed between the third pre-stress layer 54 and the adjacent electroplated surface 50 of the second piezoelectric ceramic wafer 48 for purposes of bonding the two members together. The third pre-stress layer 54 is preferably of a conductive material, preferably a metal, having a coefficient of thermal expansion/contraction greater than that of the material of the second ceramic wafer 48.

During manufacture of the transformer 10 the entire stack of laminate layers are arranged as described hereinabove and as ill illustrated in FIG. 1, and simultaneously heated to a temperature above the melting point of the adhesive layers 34, 40, 44, and 52.

Preferred such adhesive materials are described in greater detail in aforementioned U.S. patent application Ser. No. 08/864,029 which is incorporated herein by reference, but suffice it to say that other adhesive materials may be used so long as they have a melting point below that of the other laminate layers of the transformer, are capable of hardening to apply a bond between the respective pre-stress layers 36, 42, and 54 and the ceramic wafers 30, and 48 sufficient to transfer longitudinal stresses between adjacent layers when electrical current is applied to the transformer and longitudinal expansion of the input ceramic wafer occurs.

After the entire stack of laminate layers has been heated to a temperature above the melting point of adhesive materials 34, 40, 44, and 52, the entire stack is then permitted to cool to ambient temperature. As the temperature of the laminate layers falls below the solidification point of the four adhesive layers, these layer solidify, bonding them to the adjacent layers. During the cooling process, the ceramic wafers 30 and 48 become compressively stressed along their longitudinal axes due to the relatively higher coefficients of thermal contraction of the materials of construction of the pre-stress layers 36, 42, and 54. Thus, piezoelectric transducer 1 assembled as just described comprises a pair of longitudinally pre-stressed (i.e. compressed) piezoelectric ceramic wafers which are intimately bonded to each other, (albeit in the preferred embodiment of the invention separated by laminate adhesive and pre-stress layers), along one of their major faces.

In a preferred embodiment, the pre-stress layers 36, 32 and 54 and the four adhesive layers 34, 40, 44, and 52 are longer than the two ceramic wafers 30 and 48 and, accordingly, protrude beyond the ends of the ceramic wafers. Electrical terminals 56, 58 and 60 are connected, e.g. by wire and solder or other common means of attachment, to an exposed surface of the pre-stress layers 54, 42, and 36 respectively.

In the preferred embodiment, the three pre-stress layers and the four adhesive layers each compressively stress the two ceramic wafers. This compression makes the normally fragile ceramic wafers less susceptible to damage by cracking and breaking.

After final assembly, each of the ceramic wafers 30 and 48 is electrically polarized in one direction. By this is meant that each of the ceramic wafers 30 and 48 is polarized such that when a voltage potential is applied across corresponding electrodes 46 and 50 or 32 and 38 on its respective major faces, the ceramic wafer will strain longitudinally (i.e. substantially parallel to the planes of the major faces). Conversely, after polarizing, when either of the ceramic wafers is longitudinally strained (i.e. in the plane of their major faces) a voltage potential will be generated between the corresponding electrodes 46 and 50 or 32 and 38 on its respective major faces.

It will therefore be understood that application a first voltage V1 across electroplated major surfaces 32 and 38 of first ceramic wafer 30 will cause ceramic wafer 30 to longitudinally strain, which, in turn, causes second ceramic wafer 48 to longitudinally strain a substantially like amount, which, in turn, causes the production of a second voltage V2 between electroplated major surfaces 46 and 50 of the second ceramic wafer 48. The magnitude of the piezoelectrically generated voltage V2 depends upon the piezoelectric properties of the wafer material 48, the size, geometry and polarization characteristics of the wafer material, as well as the elasticity of the other laminate materials.

Figure 2:
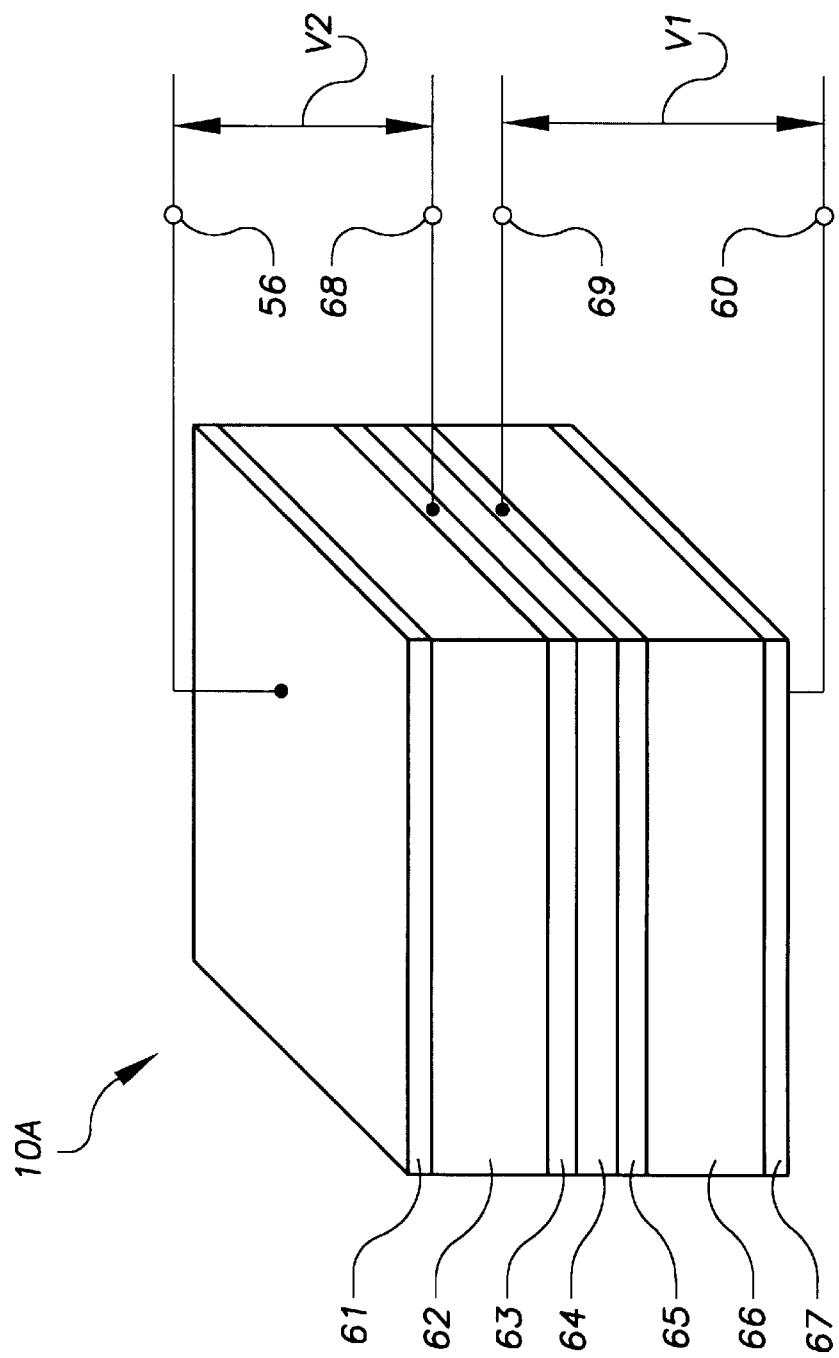
FIG. 2 is a perspective view of a modified piezoelectric transformer used in a the preferred circuit of the present invention.

While, according to the preferred embodiments just described, the transformer device of the present invention includes prestressing layers, which are attached within the device by means of adhesive layers, it is also possible and, indeed in some situations most desirable, to construct a device without prestressing layers and without any adhesive. In the case of such a device, the adhesive and prestressing layers can be omitted entirely and the ceramic layers pressed or ultrasonically welded together to provide the means for the requisite transfer of energy. In such a device, except for elimination of the prestress and adhesive layers, all other layers, i.e. means for attaching electrodes, etc, remain the same. FIG. 2 shows a modified multi-layer piezoelectric transformer 10a which may alternatively used in conjunction with the present invention. In the multi-layer piezoelectric transformer 10A of FIG. 2, a first piezoceramic layer 62 is provided with electrodes 61 and 63 on two of its opposing faces; and second piezoceramic layer 66 is provided with electrodes 65 and 67 on two of its opposing faces. The two electroded piezoceramic layers 62 and 66 are bonded together (for example, by adhesive layer 64). The two electroded piezoceramic layers 62 and 66 are electrically polarized between the opposing electrodes of the respective layers. Terminals 56, 68, 69 and 60 may be provided for electrical connection to the respective electrodes 61, 63, 65 and 67. The two intermediate facing electrodes (i.e. electrodes 63 and 65) may be electrically isolated or electrically connected to each other, depending or whether or not electrical isolation of the "primary" and "secondary" sides of the transformer 10A is desired.

Figure 5:
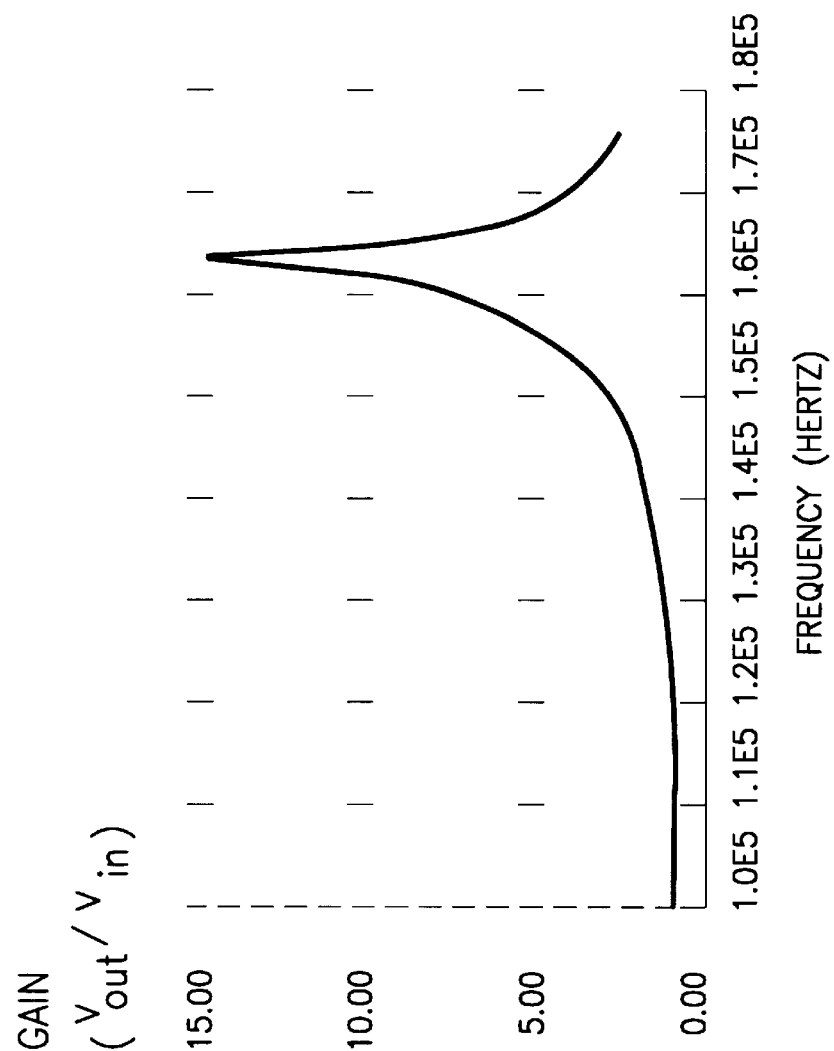
FIG. 5 is a graph of gain versus frequency for the piezoelectric transformer shown in FIG. 2.

FIG. 5 shows a graph of voltage gain versus impedance for a typical laminated transformer of the type just described. In this case, resonance, and hence maximum gain occurs at a frequency of about 16.3 kilohertz. The gain (i.e. the ratio of output voltage V2 to input voltage V1) measured at this frequency was about 14.5. From this graph (FIG. 5), it is also apparent that as the operating frequency of the transformer changes, the gain that is realized decreases. It will be appreciated that the resonant frequency, i.e. the frequency at which the transformer 10 naturally 11 tends to vibrate when physically disturbed, corresponds to the frequency at which the transformer 10 is capable of generating the highest voltage gain.

Figure 3:
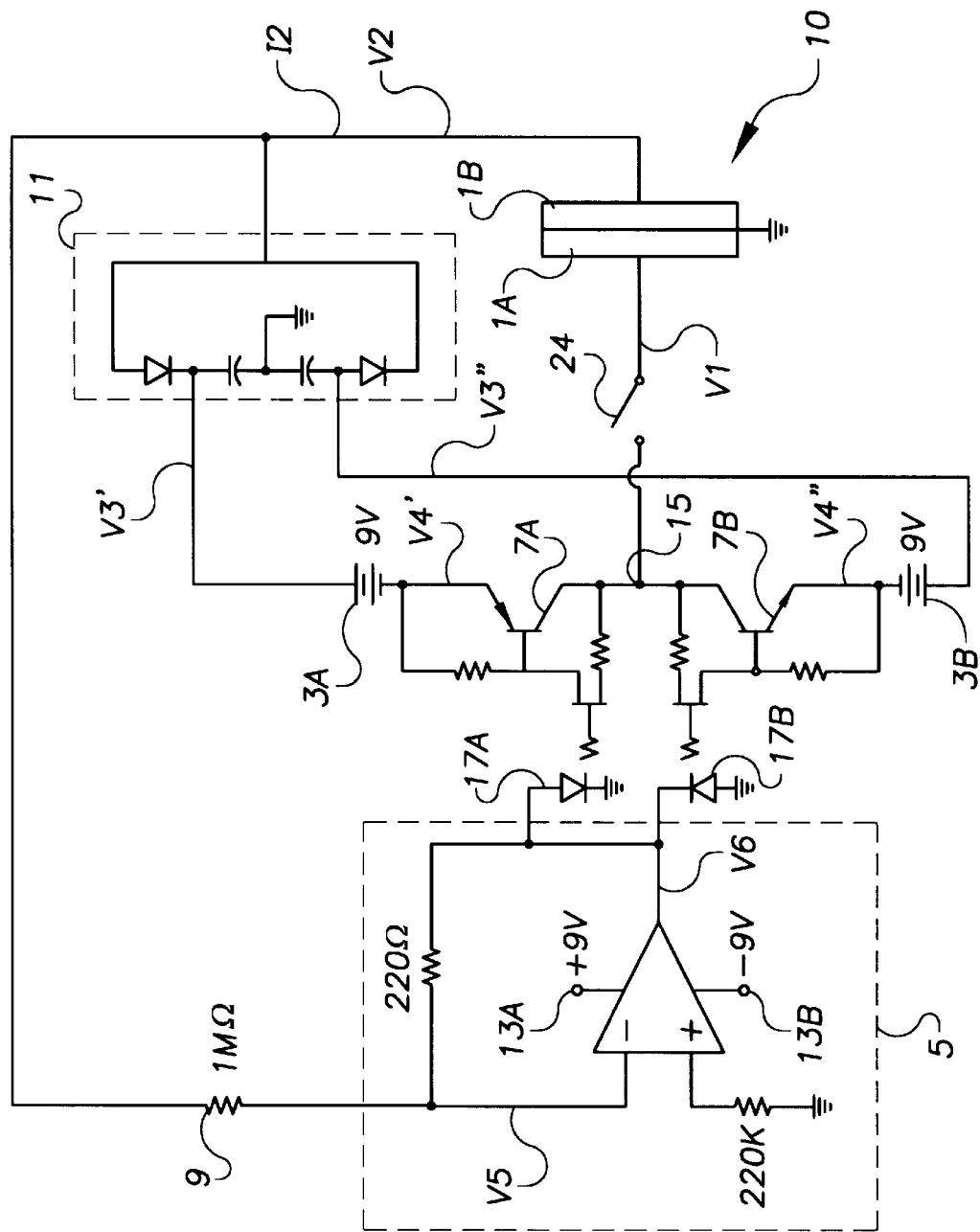
FIG. 3 is a schematic diagram of a positive feedback circuit capable of producing an audible or ultrasonic signal as described and claimed herein.

Referring now to FIG. 3 which is a schematic of the preferred circuit of the present invention, a laminated transformer 10 of the type just described is caused to oscillate by two, in this case 9 volt, batteries 3A and 3B. This voltage V1 applied to the primary side 1A of transformer 10 causes transformer 10 to flex (i.e. longitudinally deform) as just described. As seen from FIG. 2, this voltage V1 is stepped up as it is transferred to side 1B of transformer 10. In the example shown in FIGS. 2 and 5, this would initially be a gain of about 14.5 for a transducer designed to resonate at optimum frequency, (approximately 16.3 kilohertz), upon application of the 9 volt potential of the batteries. The stepped-up voltage V2 is then applied to a rectifier-capacitor array 11 that effectively doubles the magnitude of its input voltage V2. The design and assembly of rectifier-capacitor arrays as depicted at 11 is well known in the art. The output voltage V3 from rectifier-capacitor array 11 is sequentially applied to batteries 3A and 3B. Input voltage V3 to batteries 3A and 3B is added to each battery's voltage to produce a battery output V4. Voltage V4 is then applied to power transistors 7a and 7b.

Voltage output V2 from the secondary side 1B of transformer 10, in addition to being applied to rectifier-capacitor array 11, is also applied to resistor 9 which drops the voltage V2 down to a reduced voltage V5 which is in turn applied to and necessary to operate operational amplifier ("op-amp") 5. Typically, to obtain the required voltage drop, resistor 9 is on the order of at least about 1 meg-ohm. In compliance with Ohm's Law, the majority of the current I2 resulting from the application of voltage V2 is forced through rectifier-capacitor array 11 rather than through resistor 9. Only sufficient current need be passed through resistor 9 as to power op-amp 5. Nine volt power source 13A/13B is provided for the initial operation of op-amp 5. Op-amp 5 produces a voltage V6 that is of opposite polarity from voltage V5. Voltage V6 is applied as the input to optocouplers 17A and 17B. Optocouplers 17A and 17B serve to isolate high voltage V1 from low voltage V5 that is necessary to operate op-amp 5. Depending on the polarity of voltage V6, it (voltage V6) is applied to either power transistor 7a or 7b.

When voltage V6 is applied to either power transistor 7a or 7b, the corresponding power transistor (7A or 7B) is activated, resulting in voltage V4 at terminal 15. For any given half cycle of operation of this circuit, the voltage at terminal 15 will temporarily and instantaneously be of opposite polarity from voltage V1. Thereafter, for the next half cycle, V1 will assume the value and polarity of V4.

The cycling of stepped-up voltage V2 from secondary side 1B back to primary side 1A of transformer 10 is continuous so long as the circuit is not interrupted. Eventually the system reaches steady state, the transducer stepping up incoming voltage V1 at a reduced level as the impedance of the circuit increases, and the 9 volt batteries 3A and 3B compensate for any losses in the system. Typically, the time necessary for operation to reach steady state is a few cycles or enough time for the circuit to generate sufficient current to charge the capacitors of rectifier-capacitor array 11.

Activation of the circuit is controlled by the closing of switch 24. As will be recognized by the skilled artisan, switch 24 can be placed at any number of positions within the circuit, and its location as shown is merely a matter of convenience. Activation of switch 24 can be achieved due any of a number of causes, but is most generally accomplished in response to a signal from a sensor of one sort or another, for example a heat or smoke detector in the case of a fire alarm.

As the skilled artisan will recognize, batteries 3A and 3B can, of course, be replaced with a single power source. It will also be recognized that the circuit can be used to drive a resonating high voltage transformer 10 with a relatively low voltage power supply such as a battery.

Typically, the human range of hearing falls between 500 and 20,000 hertz. Selection of a transformer 10 that resonates within this range will result in a horn or alarm which emits an audible signal when the circuit is actuated. Selection of a transformer that resonates outside of this range will produce an ultrasonic emitter whose energy can be used with attachments or tools that require vibration at a specified frequency such as a razor, oscillating toothbrush etc., such oscillation being provided by the voltage induced movement of piezoelectric resonant transducer or transformer 10.

Figure 4:
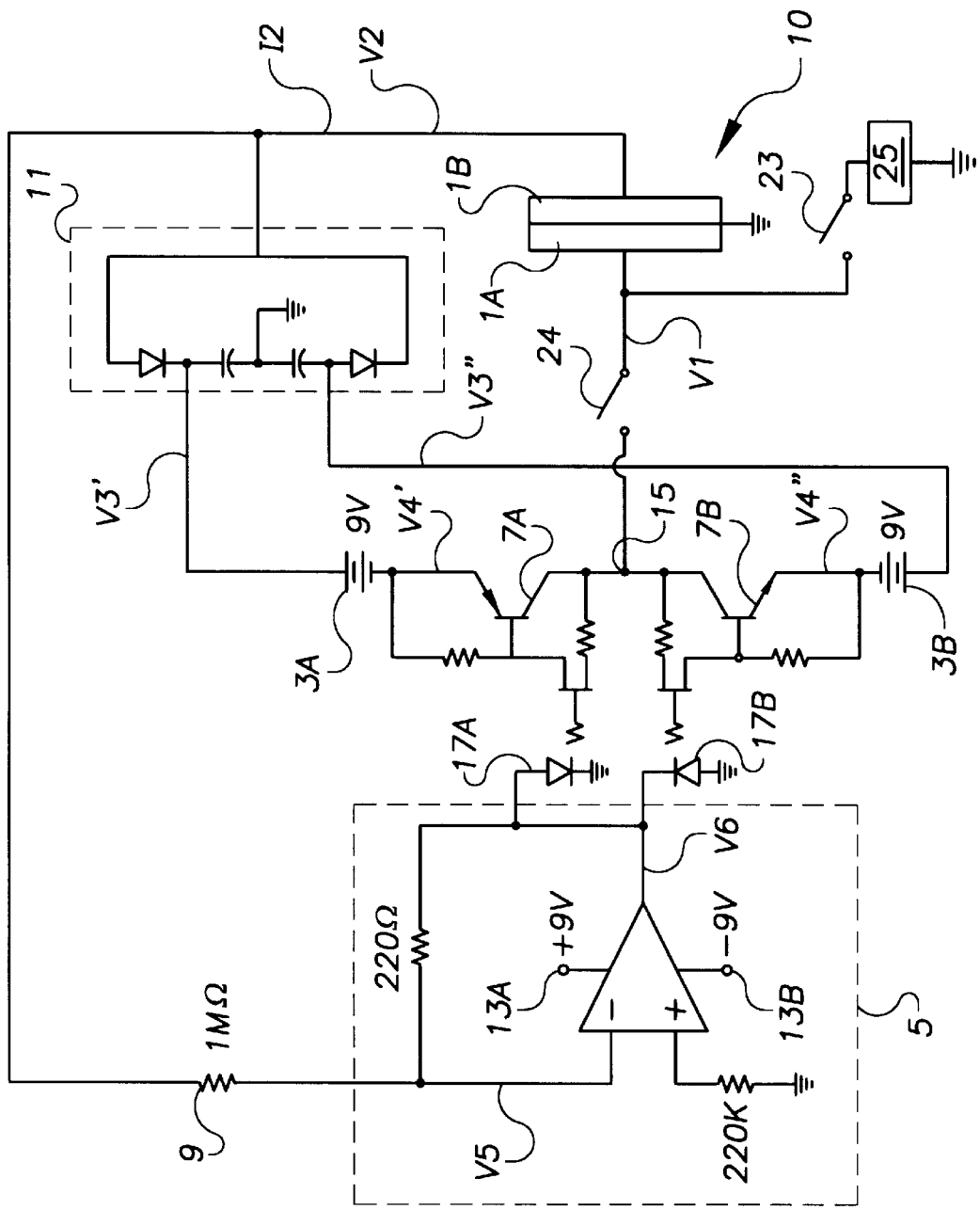
FIG. 4 is a schematic diagram of the positive feedback circuit of the present invention being used to power a connected high voltage electronic device.

As shown in FIG. 4, a portion of the electrical energy at terminal 15 (i.e. at voltage V1) can be conducted from the positive feedback amplifier circuit to power an auxiliary device 25, while the complement of same is conducted to the primary side 1A of the transformer 10. Actuation of auxiliary device 25 is caused by the closing of switch 23. According to a preferred embodiment of the present invention, auxiliary device 25 is a piezoelectric actuator which can in turn upon actuation by voltage V1 produce mechanical motion for purposes of producing sound or vibration, or inducing other appropriate mechanical or vibratory motion.

Voltage V1 may be rectified or not depending upon the energy requirements of auxiliary device 25. Design and installation of an appropriate rectifier circuit to accomplish this are well within the capabilities of the skilled artisan.

Figure 6:
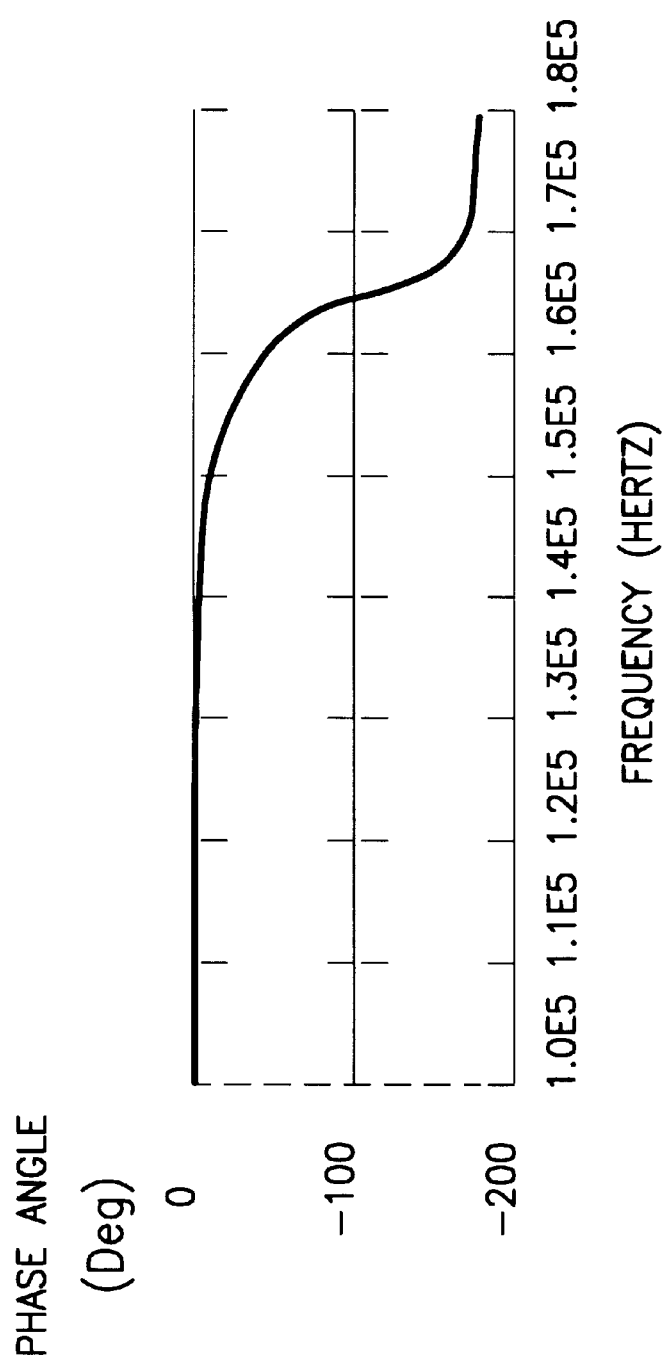
FIG. 6 is a graph of input voltage to output voltage phase angle difference for the piezoelectric transformer shown in FIG. 2.

In certain embodiments of the present invention there occurs an inherent phase shift between the primary 1A and secondary 1B sides of the transformer 10. FIG. 6 illustrates the phase angle relationship between input and output voltages of a particular construction of transformer at different input frequencies. In the particular case illustrated in FIG. 6, there is a phase angle difference of approximately −90 degrees at resonant frequency (16.3 kilohertz). In order to efficiently operate such a transformer at its resonant frequency, it is useful to include phase shifting circuitry in order to maintain the supplemented input voltage to the primary side 1A of the transformer 10 in the desired phase relationship with the output voltage at the secondary side 2A of the transformer 10. Design and installation of appropriate phase shifting circuitry to accomplish this are well within the capabilities of the skilled artisan.

Since the circuit just described is assembled from generally well-known and readily available low or moderate cost components of relatively small size, it is optimally suited for use in small appliances or tools such electric razors, toothbrushes, smoke detectors, etc.

While preferred embodiments of the invention have been shown and described, various modifications and substitutions may be made thereto without departing from the spirit and scope of the invention. Accordingly, it is to be understood that the present invention has been described by way of illustration, and that the scope of the invention is intended to be limited only by the scope of the appended claims.

What is claimed is:

1. A positive feedback amplifier circuit comprising:

a transformer having an input side and an output side, a rectifier-capacitor array having an input side and an output side, said input side of said array being electrically connected to said output side of said transformer, wherein said array is capable of increasing a voltage input to said input side of said array from the output side of the transformer, a first low voltage power source having an output, a pair of power transistors;

wherein an output of the rectifier-capacitor array is applied and added to an output of said first low voltage power source to provide a supplemented low voltage to said pair of power transistors;

and further comprising a resistor, said resistor being connected to said output side of said transformer in parallel with said rectifier-capacitor array;

a pair of optocouplers;

a low voltage operational amplifier having an input and an output, said input to said low voltage operational amplifier being electrically connected to an output from said resistor, said output from said low voltage operational amplifier being electrically connected to said pair of optocouplers, and wherein said low voltage operational amplifier is capable of delivering a voltage of opposite polarity from said output from said resistor to said pair of optocouplers;

wherein said pair of optocouplers are electrically connected to said pair of power transistors;

and wherein an output of each of said pair of power transistors is electrically connected to said input side of said transformer, whereby said pair of power transistors may alternately supply power to the input side of the transformer;

and a switch whose closing activates the electrical circuit.

2. The electrical circuit of claim 1 wherein the transformer is a laminated, multilayered, piezoelectric transducer.

3. The electrical circuit of claim 2 wherein the laminated, multilayered, piezoelectric transducer comprises a first polarized ceramic layer having two opposing major faces disposed on opposite sides of a first longitudinal axis, a second polarized ceramic layer having two major opposing faces which are disposed on opposite sides of a second longitudinal axis, said first and second longitudinal axes being parallel to each other;

and wherein the first polarized ceramic wafer is bonded to the second polarized ceramic wafer such that a major face of the first polarized ceramic layer and a major face of the second polarized ceramic layer are in opposed spatial relation to each other;

and wherein the direction of polarization of said first polarized ceramic layer and the direction of polarization of said second polarized ceramic layer are the same.

4. The electrical circuit of claim 3 wherein the laminated, multilayered, piezoelectric transducer produces a signal in the range of 500 to about 20,000 hertz upon activation by closure of the switch.

* * * * *